United States Patent
Usoskin (10) Patent No.: US 8,150,486 B2
(45) Date of Patent: Apr. 3, 2012

(54) SUPERCONDUCTING DEVICE FOR CURRENT CONDITIONING

(75) Inventor: Alexander Usoskin, Hoesbach (DE)

(73) Assignee: Bruker HTS GmbH, Hanau (DE)

( * ) Notice: Subject to any disclaimer, the term of this patent is extended or adjusted under 35 U.S.C. 154(b) by 632 days.

(21) Appl. No.: 12/397,440

(22) Filed: Mar. 4, 2009

(65) Prior Publication Data

US 2009/0270261 A1   Oct. 29, 2009

(30) Foreign Application Priority Data

Mar. 5, 2008   (EP) .................... 08004094

(51) Int. Cl.
*H01L 39/16* (2006.01)
*H02H 9/02* (2006.01)

(52) U.S. Cl. ........... 505/220; 505/236; 505/850; 361/19

(58) Field of Classification Search ............. 505/220, 505/236, 850; 361/19; 174/125.1
See application file for complete search history.

(56) References Cited

U.S. PATENT DOCUMENTS

| | | | | |
|---|---|---|---|---|
| 5,083,232 | A * | 1/1992 | Bergsjo et al. | 361/11 |
| 6,819,536 | B2 * | 11/2004 | Chen et al. | 361/19 |
| 7,586,717 | B2 * | 9/2009 | Usoskin et al. | 361/19 |
| 2008/0026946 | A1 | 1/2008 | Yamasaki et al. | |

FOREIGN PATENT DOCUMENTS

| | | |
|---|---|---|
| DE | 19856425 A1 | 7/1999 |
| DE | 10226393 B4 | 7/2004 |
| EP | 0 345 767 | 12/1989 |
| JP | 2004-104840 | 2/2004 |

OTHER PUBLICATIONS

Kubota, H., et al.; "A New Model of Fault Current Limiter Using YBCO Thin Film", IEEE Transactions on Applied Superconductivity, vol. 9, No. 2., pp. 1365-1368, Jun. 1999.

* cited by examiner

*Primary Examiner* — Mark Kopec
(74) *Attorney, Agent, or Firm* — King & Spalding L.L.P.

(57) ABSTRACT

The device has a quenchable superconductor (1), a first metallic member (2) electrically coupled with the quenchable superconductor (1), a second metallic member (3) electrically coupled to the first metallic member (2). The first metallic member (2) is thermally and electrically coupled with the quenchable superconductor (1) due to their direct surface contact. The superconducting device has a second metallic member (3) with a resistive element (4) and an electrical coupling (5) with the first metallic member (2). The resistive element (4) of the second metallic member (3) is thermally decoupled from the first metallic member (2). The first metallic member (2) has a substantially higher electrical resistance compared to the second metallic member (3).

23 Claims, 4 Drawing Sheets

SUPERCONDUCTING DEVICE FOR CURRENT CONDITIONING

CROSS-REFERENCE TO RELATED APPLICATIONS

This application claims the benefit of European Patent Application No. 08004094.22-222 filed Mar. 5, 2008, all which are incorporated herein by reference.

TECHNICAL FIELD

The invention relates to a superconducting device to be employed in electrical power conditioners. More particularly, the invention relates to a superconducting device for use in superconducting transformers, superconducting fault current limiters, superconducting power devices for phase correction, etc.

BACKGROUND

Principles of construction and functionality of superconducting power conditioners, as transformers, current conditioners (or so called fault current limiters), are generally known, e.g. from EP 0 345 767 A1 which discloses a superconducting device for current conditioning. The device is based on a quenchable superconductor which is capable to quench from a superconducting state comprising zero resistance to a quenched state comprising a non-zero resistance when the transporting current exceeds a critical value. The device comprises further a metallic member electrically coupled with the quenchable superconductor. The metallic member consists of a resistive element (as a thin metallic layer or multilayer) which is thermally coupled with quenchable superconductor. The device comprises also means for cooling and heat interchange between different parts of the superconducting element and between the superconducting element and a cooler or a cooling medium, and also means for electrical coupling. In operation, the quenchable superconductor is responsible for increase of the impedance of the device at circuit over-currents and due to this to limit fault current to a predetermined level. The task of metallic member, that is according to the EP 0 345 767 A1 shaped as a layer, is to protect the quenchable superconductor against local overheating so called "hot spots") which may easily destroy the device comprising a slight inhomogeneity of the critical current.

A similar device but with a metallic member which is periodically interrupted in direction of current transport is known from DE 198 56 425 A1. Such metallic member, as a resistive element, may be formed as a layer with a meander shape. The device comprises a perfect thermal coupling of the metallic member with a quenchable superconductor as the main part of superconducting surface stays is direct contact with the metallic member. In test under overcurrents, the device comprises long transient time of quenching (3-5 ms) and long recovery time (typically 800-1500 ms) that corresponds to the time required for returning of the quenchable superconductor at the initial superconducting state after interruption of current transport.

A further superconducting device for current conditioning is known from IEEE Trans. Appl. Supercond. vol. 9, pp. 1365-1368, 1999. The device comprises a quenchable superconductor, a metallic member, means for cooling and heat interchange between different parts of the superconducting element and between the superconducting element and a cooling medium, and means for electrical coupling. The metallic member comprises a resistive element and means for electrical coupling with the quenchable superconductor. The metallic member is electrically and thermally coupled with the quenchable superconductor. Electrical coupling is provided by a plurality in In wires bonded to the quenchable superconductor and a further plurality of In wires jointed to a metallic strip based on a thin Au film. The thermal coupling originates from the means used for electrical coupling (In (indium) wires) in one part, and in other part, through a transverse heat flow in In wired bonded to the Au film and to a substrate ($LaAlO_3$) where the layer of quenchable superconductor is deposited.

A superconducting device for current conditioning known from DE 102 26 393 B4 comprises a quenchable superconductor and a metallic member electrically coupled with the quenchable superconductor. The device comprises further means for electrical coupling and means for cooling of different parts of the device through heat interchange with a cooler or a cooling medium. The metallic member is based on a resistive element made of a resistive foil. The resistive element of the metallic member is thermally coupled with the quenchable superconductor as a substantial part of the heat that is generated in the resistive element is transferred to the superconductor through jointing areas. This happens because the heat in the quenched modus is generated over entire metallic member and, therefore, right nearby to these joints. The resistive foil comprises either a wavy or a "zigzag" shape when it is viewed in plane that is parallel to both the normal to the surface of the quenchable superconductor and the direction of current transport in non-quenched state of the superconductor. In quench and recovery steps, the device comprises medium transient time of quenching (1-3 ms) and long recovery time (typically 200-800 ms).

All of the above-referenced devices aim to condition electrical current in an external circuit which is connected in series to the superconducting device. They may provide the function of a current limiter which results in limitation of the over-currents. However, the prior art devices comprise a reaction time and recovery time (that follow after each quench event) which are too slow for many applications and may be too slow for efficient control of electric power.

It is desirable to further improve the performance of current conditioning devices and to provide a more efficient control of electrical power where much shorter response and recovery times are required in order to not only provide a fast circuit protection but also to provide an desired quick dynamics for such protection as well as reliability of energy supply.

Furthermore, the above-referenced devices comprise an insufficient stability at current overloads which result in inhomogeneous, sometimes in non-reproducible sharing of currents between the quenchable superconductor and the metallic member. Consequently, this causes an insufficient damage threshold at overloads.

SUMMARY

According to various embodiments, a superconducting device for conditioning of the electrical current can be provided with a fast response time and with short recovery time.

According to further embodiments, a superconducting device can be provided which may be produced more cost-effectively and to increase a threshold of damage of the device at overloads.

According to an embodiment, a superconducting device for current conditioning may comprise a quenchable superconductor which is capable to quench from a superconducting state comprising zero resistance to a quenched state comprising a non-zero resistance when the transporting current exceeds a critical value, a first metallic member electrically coupled with the quenchable superconductor, and thermally coupled with the quenchable superconductor, wherein the superconducting device comprises a second metallic member comprising a resistive element and means for electrical coupling the resistive element with the first metallic member, the resistive element of the second metallic member is thermally decoupled from the first metallic member, the first metallic member comprises a substantially higher electrical resistance compared to the second metallic member.

According to a further embodiment, the resistive element of the second metallic member may be electrically coupled with the first metallic member by a plurality of strips as the means for electrical coupling. According to a further embodiment, each strip from the plurality of strips can be electrically joined with the first metallic member and with the resistive element. According to a further embodiment, the means for electrical coupling with the first metallic member may comprise additional means for thermal coupling with a cooler or cooling medium. According to a further embodiment, the additional means may comprise an additional contacting surface that is provided at a strip that belongs to the plurality of strips. According to a further embodiment, the contacting surface can be located in the middle of the strip. According to a further embodiment, the plurality of strips can be joined with the first metallic member comprising a jointing area that comprises from 2 to 30% area fraction of the total surface of the first metallic member. According to a further embodiment, at least some of the strips from the plurality of strips joined with the first metallic member may comprise a jointed part that possesses an angle from 45° to 135° relative to the direction of current flow in the quenchable superconductor in the superconducting state. According to a further embodiment, the resistive element and the first metallic member can be spaced apart by a low thermal conducting medium or by the cooling medium. According to a further embodiment, the electrical resistance of each strip can be lower than the electrical resistance of the resistive element measured between two neighboring strips in the direction of current flow in the quenchable superconductor in the superconducting state by a factor of 10-2000. According to a further embodiment, the electrical resistance of the quenchable superconductor in the quenched state may exceed the electrical resistance of the first metallic member by a factor f1, wherein $2 \leq f1 \leq 500$. According to a further embodiment, the electrical resistance of the first metallic member may exceed the electrical resistance of the second metallic member by a factor f2, wherein $5 \leq f2 \leq 200$. According to a further embodiment, the first metallic member may comprise a heat capacity per unit length that is from 5 to 20000 times lower than the heat capacity per unit length of the second metallic member. According to a further embodiment, the quenchable superconductor can be a superconducting film deposited on a substrate. According to a further embodiment, the substrate may be provided with at least one buffer layer. According to a further embodiment, the quenchable superconductor may comprise a $ReBa_yCu_zO_{7-u}$-based composition or a $((Re1_w+Re2_{x-w})Ba_yCu_zO_{7-u})$-based composition where Re, Re1 and Re2 denote one or more metals from the group consisting of Y, Ho, La, Pr, Nd, Gd, Sm, Sc, Tu, Tb, Dy, and Yb, Re1 differs from Re2 and where x is taken from the range from 0.8 to 1.2, y is taken from the ranges from 1.6 to 2.4, z is taken from the range from 2.4 to 3.6, and u and w are taken from the range from 0.05 to 0.95. According to a further embodiment, the first metallic member can be a layer of a normal metal as Ag, Au, Zn, Cu, Ni, Cr, Pt, W, Ta, Ti, Mo or an alloy comprising one or more of these metals. According to a further embodiment, the second metallic member may comprise a material or materials which comprise one or more of the normal metals as Ag, Au, Re, Pt, Cu, Zn, Al, Fe, Ni, Cr, W, Ta, Mn, Mg, Ti, Mo or combination of these metals or their alloys. According to a further embodiment, the means for electrical coupling with the first metallic member may comprise at least one of solder and spot welded joints. According to a further embodiment, an assembly comprising the quenchable superconductor, the first metallic member and the second metallic member may comprise further an insulating spacer attached to one of the outer surfaces of the assembly. According to a further embodiment, the insulating spacer can be partly transparent for the cooling medium. According to a further embodiment, the superconducting device may further comprise means for electrical coupling an external current source to the quenchable superconductor. According to a further embodiment, the superconducting device may further comprise means for cooling at least parts of the device through heat interchange with a cooler or a cooling medium.

BRIEF DESCRIPTION OF THE DRAWINGS

The superconducting device according to the invention can be better understood with reference to the following drawings and description. The components in the figures are not necessarily to scale, instead emphasis is placed upon illustrating the principles of the device. Moreover, in the figures, like reference numerals designate corresponding parts. In the drawings.

DETAILED DESCRIPTION

A superconducting device for current conditioning is provided which comprises a quenchable superconductor which is capable of quenching from a superconducting state comprising zero resistance to a quenched state comprising a non-zero resistance when the transporting current exceeds a critical value. A first metallic member is electrically and thermally coupled with the quenchable superconductor. The superconducting device comprises further a second metallic member comprising a resistive element and means for electrical coupling with the first metallic member. The resistive element of the second metallic member is thermally decoupled from the first metallic member. The first metallic member comprises a substantially higher electrical resistance compared to the second metallic member.

In an embodiment, a superconducting device for current conditioning is provided in which the resistive element of the second metallic member is electrically coupled with the first metallic member using a plurality of strips as the means for electrical coupling where each strip is electrically jointed with the first metallic member and with the resistive element.

The means for electrical coupling with the first metallic member may comprise additional means for thermal coupling with the cooler or cooling medium; these additional means comprise an additional contacting surface that is provided at a strip that belongs to the plurality of strips; the contacting surface is located preferably in the middle of the strip.

The plurality of strips may be jointed with the first metallic member comprising a jointing area that comprises from 2 to 30% area fraction of the total surface of the first metallic member.

In an embodiment, at least some of the strips jointed with the first metallic member comprise a jointed part that possesses an angle from 45° to 135° relatively the direction of current flow in the quenchable superconductor being in the superconducting state.

The resistive element and the first metallic member are may be spaced apart by a low thermal conducting medium or by the cooling medium.

In an embodiment, the electrical resistance of each strip is by a factor of 10-2000 lower than the electrical resistance of the resistive element measured between two neighboring strips in the direction of current flow in the quenchable superconductor being in the superconducting state, while the electrical resistance of the quenchable superconductor in the quenched state exceeds the electrical resistance of the first metallic member by a factor that may vary from 2 to 500.

In an embodiment, the electrical resistance of the first metallic member exceeds the electrical resistance of the second metallic member by a factor that may vary from 5 to 200. The first metallic member may comprise heat capacity per unit length from 5 to 20000 times lower compared to that of the second metallic member.

In an embodiment, the quenchable superconductor is a superconducting film deposited on a substrate which is provided with at least one buffer layer.

In an embodiment, the quenchable superconductor may have the following cross-sectional architecture: substrate, at least one buffer layer arranged on the substrate, a cap layer arranged on the buffer layer and a superconducting film arranged on the cap layer.

In embodiments, the substrate may be Ni—Cr stainless steel, or Ni—Cr alloys such as Hastelloy, particularly Hastelloy C276. The substrate may have a thickness in the range 0.01 mm to 1 mm The at least one buffer layer may comprise a total thickness, the total thickness being the distance from the substrate surface to the outer surface of the last buffer layer of 0.3 micrometer to 3 micrometer.

In further embodiments, the at least one buffer layer is provided in a way that it exhibits an in-plane crystalline texture. The buffer layer may be provided by epitaxial growth of the buffer layer on an underlying substrate of buffer layer having an in-plane texture. The buffer layer may also be provided by IBAD (Ion Beam Assisted Deposition) for example.

The at least one buffer layer is provided in a way that its own in-plane crystalline texture induces an in-plane crystalline texture in the superconducting film.

The cap layer may comprises $CeO_2$ and/or other oxides of Zr, Ba, Gd, Y and may comprise a thickness from 0.02 micrometer to 0.3 micrometer.

The quenchable superconductor may be provided in the form of a film deposited on the architecture, substrate, buffer layer or buffer layers, cap layer described above. The superconducting film may have thickness from 0.3 micrometer to 10 micrometers.

The quenchable superconductor may comprise a $Re_xBa_yCu_zO_{7-u}$ composition or on a mixture as $(Re1_w+Re2_{x-w})Ba_yCu_zO_{7-u}$ where Re, Re1 and Re2 denote one or more metals from the group consisting of Y, Ho, La, Pr, Nd, Gd, Sm, Sc, Tu, Tb, Dy, and Yb, Re1 differs from Re2, and where x is taken from the range from 0.8 to 1.2, y is taken from the range from 1.6 to 2.4, z is taken from the range from 2.4 to 3.6, and u and w are taken from the ranges from 0.05 to 0.95.

In further embodiments, the first metallic member may be a layer of normal metal as Ag, Au, Zn, Cu, Ni, Cr, Pt, W, Ta, Ti, Mo or alloys comprising one or more of these metals; the second metallic member is based on a material or materials which comprise one or more normal metals as Ag, Au, Re, Pt, Cu, Zn, Al, Fe, Ni, Cr, W, Ta, Mn, Mg, Ti, Mo or combination of these metals or their alloys. The means for electrical coupling with the first metallic member comprise solder or/and point welded joints. The first metallic member and the second metallic member comprise further an insulating spacer attached to one of the outer surfaces of the assembly; the insulating spacer is partly transparent to the cooling medium.

In an embodiment, the superconducting device further comprising means for electrical coupling an external current source to the quenchable superconductor and/or means for cooling at least parts of the device through heat interchange with a cooler or a cooling medium.

Figure 1:
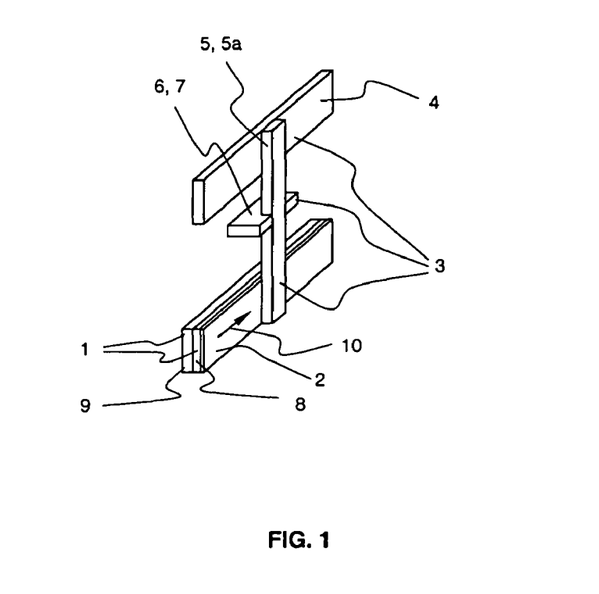
FIG. 1 illustrates a schematic view of a superconducting device for current conditioning according to a first embodiment.

FIG. 1 illustrates a schematic view of a superconducting device for current conditioning. The device comprises a quenchable superconductor 1, a first metallic member 2 electrically coupled with the quenchable superconductor 1, a second metallic member 3 electrically coupled to the first metallic member 2.

The first metallic member 2 is thermally and electrically coupled with the quenchable superconductor 1 due to a direct surface to surface contact between the first metallic member 2 and the quenchable superconductor 1.

The superconducting device comprises a second metallic member 3 comprising a resistive element 4 and means 5 for electrical coupling with the first metallic member. The resistive element 4 of the second metallic member 3 is thermally decoupled from the first metallic member 2. To achieve this thermal decoupling, the resistive element 4 of the second metallic member 3 and the first metallic member 2 are spaced apart from one another. The space between the resistive element 4 and the first metallic member 2 is substantially filled by a low thermal conducting medium or by the cooling medium (not shown in the FIG. 1) when the superconducting device is in operation.

As used herein, thermally decoupled describes an arrangement by which a temperature rise or fall in the resistive member 4 fails to produce a corresponding rise or fall in the temperature of the quenchable superconductor 1 and vice versa.

The first metallic member 2 comprises a substantially higher electrical resistance compared to the electrical resistance of the second metallic member 3.

As used herein, a substantially higher electrical resistance of the first metallic member comprises compared to the second metallic member is defined as a factor of at least two.

The resistive element 4 of the second metallic member 3 is electrically coupled with the first metallic member 2 using a plurality of strips 5 as the means for electrical coupling. One of such strips 5a is illustrated schematically in FIG. 1. Each strip 5a is electrically jointed with the first metallic member 2 and with the resistive element 4.

In the first embodiment, the resistive member 4 has a strip-like form whose long direction is arranged approximately parallel to the long direction of the quenchable superconductor 1 which also has a strip-like form so that the resistive member 4 is spaced at a distance adjacent a side edge of the quenchable superconductor 1. The major surface of the resistive member 4 and of the quenchable superconductor 1 are generally coplanar.

The strip 5a of the second metallic member extends generally perpendicularly to the side edge of the resistive member 4 and to the side edge of the quenchable superconductor 1 so that each end of the strip 5a is arranged on a major surface of the first metallic member 2 and on a major surface of the resistive element 4, respectively.

The means 5 for electrical coupling with the first metallic member comprise additional means 6 for thermal coupling with the cooler or cooling medium. The additional means comprise an additional contacting surface 7 that is provided at a strip 5a. The contacting surface 7 is located preferably in the middle of the strip 5a so that it is arranged in the space between the resistive member 4 and the quenchable superconductor 1.

The quenchable superconductor 1 employed in this embodiment is a superconducting film 8 deposited on a substrate 9. In the superconducting state, the quenchable superconductor transports the current flow in the long direction of the strip-like superconductor 1 indicated in FIG. 1 with arrow 10.

The chemical composition of the superconducting film 8 corresponds to $YBa_2Cu_3O_{6.8}$ that was deposited onto the substrate 9 by a pulsed laser deposition. Thickness of the film 8 may vary from 0.3 to 4.0 micrometer; a 1.1 micrometer thickness was used in an embodiment.

In other embodiments, the superconducting film 8 comprises a composition having a general formula of $Re_xBa_yCu_zO_{7-u}$ or $((Re1_w+Re2_{x-w})Ba_yCu_zO_{7-u}$, where Re, Re1 and Re2 denote one or more metals from the group consisting of Y, Ho, La, Pr, Nd, Gd, Sm, Sc, Tu, Tb, Dy, and Yb, Re1 differs from Re2, and where x is taken from the range from 0.8 to 1.2, y is taken from the ranges from 1.6 to 2.4, z is taken from the range from 2.4 to 3.6, and u and w are taken from the range from 0.05 to 0.95.

The substrate 9 is made from a highly polished stainless steel tape, which in an embodiment is 0.1 mm thick and 4 mm wide. The substrate 9 may be also based on different materials as Ni— or Ni—Cr alloys, Ni—Cr stainless steel, or Ni—Cr alloys such as Hastelloy, particularly Hastelloy C276, or ceramics such as yttria stabilized zirconia, aluminia, ceria, etc.). The substrate 9 may be composed from sub-layers of different materials from above referred ones. Substrate thickness may vary from 10 micrometers to 300 micrometers, depending on power consumption and other requirements on performance of the superconducting device. In a further embodiment, the substrate has a thickness from 0.01 mm to 1 mm.

The substrate 9 is provided with at least one buffer layer (not shown in FIG. 1) which allows to the quality of the superconducting film 8 to be improved. The at least one buffer layer is provided in a way that it has an in-plane crystalline texture. The outermost buffer layer or cap layer, if one is provided, may induce a preferred texture, in particular, an in-plane texture in a superconducting film deposited on the outermost buffer layer. This leads to an increase in the critical current density and, in particular, the critical current density of the superconducting film in an applied magnetic field.

The buffer layer may formed as single layer or comprise a number of sub-layers. The sub-layers may comprise different oxides or nitrides from the group consisting of yttria, ceria, aluminia, yttria stabilized zirconia, gadolinia, gadolinium zirconate, titanium nitride, or their combinations. The at least one buffer layer may have a total thickness, i.e. the distance from the substrate surface to the outer surface of the last buffer layer, from 0.3 micrometer to 3 micrometer.

In an embodiment, two sub-layers were employed as a buffer layer. The first sub-layer is yttria stabilized zirconia layer deposited via an ion beam assisted sputtering in a way that the buffer layer comprises an in-plane texture characterized by a full-width at half-maximum angle of 10.5°. Typical range of thicknesses of the buffer layer is from 0.5 to 2 micrometer. In an example, a 1.6 micrometer thickness was employed.

The second sub-layer is ceria ($CeO_2$) layer, from 0.03 to 0.6 micrometers thick. In the considered example the thickness of the ceria was 0.1 micrometers. The $CeO_2$ layer was deposited via pulsed laser deposition. The buffer layer may have different chemical composition as single layer of a number of sub-layers. 7.

A cap layer may be provided on the outermost buffer layer which comprises $CeO_2$ or other oxides of Zr, Ba, Gd, Y. 8. The cap layer may have a thickness from 0.02 micrometer to 0.3 micrometer.

To summarize, the quenchable superconductor may have the following cross-sectional architecture: substrate/at least one buffer layer/a cap layer/a superconducting film.

The first metallic member 2 can acts as a shunt to dissipate hot spots which occur in the superconductor when the superconductor quenches. The first metallic member 2 may be a layer of normal metal, in the given case of Au, 0.02 micrometer thick, deposited onto the quenchable conductor surface. Depending on the design of the device and material employed for manufacturing of the first metallic member 2, this thickness may vary from 0.01 to 2 micrometer.

Further materials which may be used for providing the layer of normal metal providing the first metallic member 2 comprise Ag, Au, Zn, Cu, Ni, Cr, Pt, W, Ta, Ti, Mo or alloys comprising some of these metals.

The layer of normal metal may also comprise a number of sub-layers based on the materials quoted above. For example, the first metallic member 2 may be composed from two or more sub-layers as a first sub-layer of Ag, second sub-layer of Cu, and third sub-layer of Ni.

In a further embodiment, the second sub-layer, e.g. of Cu, may be deposited onto the interface of the first sub-layer in a way that allows local areas of the second sub-layer aimed for a jointing of the strips 5a (e.g. by soft soldering). The latter way was employed in order to manufacture the superconducting device in an embodiment.

The electrical resistance of the quenchable superconductor 1 in the quenched state exceeds the electrical resistance of the first metallic member 2 by a factor that may vary from 2 to 500. This is provided through the choice of a ratio of thicknesses of the quenchable superconductor 1 and of the first metallic member 2.

In the case of a 0.02 micrometer gold layer used as the first metallic member 2 and the thickness of the quenchable superconductor being 1 micrometer, the ratio of corresponding resistances equals about 3.

At larger thicknesses of the Au layer, e.g. 0.2 micrometer, this ratio increases to 30. Ratios higher than 500 lead to increase of recovery time because of too high heat dissipation in the first metallic member. On the other hand, ratios lower than 2, which may be achieved employing e.g. Ni—Cr thin layer as the first metallic member, are not sufficient in terms of protection against the "hot-spots" and, therefore, are not as suitable for use in a superconducting device which undergoes quenches, i.e. for current conditioning because of possible damage of the device after quenching.

Further, the first metallic member 2 comprises from 5 to 20,000 times lower heat capacity per unit length compared to the second metallic member 3. In the example, this is provided by thin film form of the first metallic member 2. The second metallic member 3 is manufactured of foils which have much higher thickness. Ratio of the heat capacity per unit length of the first metallic member and of the second metallic member approximately equals to 4,500.

In different geometries, including possible thickness variations (that corresponds to optimization of the entire device in operation modus) the ratio can reach 20,000. Lowest ratio numbers, as e.g. 5, are possible in the superconducting device comprising relatively thick first metallic member 2.

The second metallic member that comprises the resistive element 4 and the means for electrical coupling with the first metallic member 2 may be manufactured from one or several normal metals as Ag, Au, Re, Pt, Cu, Zn, Al, Fe, Ni, Cr, W, Ta, Mn, Mg, Ti, Mo or combination of these metals or their alloys. In the present example, the resistive element 4 is made from a 100 micrometer thick foil of a Ni—Cr alloy comprising also Fe and Si. The means for electrical coupling, i.e. the strips 5a, are made of 0.1 mm thick and 2 mm wide Cu foil. A length or the part of the strip 5a which is not coupled either with the resistive element or with the first metallic member is 10 mm.

The electrical resistance of each strip 5a is lower by a factor of 10-2000 than the electrical resistance of the resistive element 4 measured between two neighboring strips in the direction of current flow 10 in the quenchable superconductor 1 being in the superconducting state. This is provided by choice of materials and geometry of the resistive element 4 and the strips 5a.

In an embodiment, the electrical resistance of the strip 5a is 0.3 milliohm and the electrical resistance of resistive element 4 between the strips 5a equals to 100 milliohms. Thus, the strip resistance is a factor of 333 lower than the described partial resistance of the resistive element 4.

Nevertheless, even a factor of 10 allows to achieve a sufficient "splitting" of thermal effects occurring in the quenchable superconductor 1 and the resistive element 4 and may be acceptable for the superconducting device. Factors of more than 2000 lead finally to a thickening of cross-section of the strips 5a, and as a result to growth of their heat capacity and, in the end, lower reaction and recovery times of the device.

The means for electrical coupling 5 with the first metallic member 2 comprise solder or/and spot-welded joints. In an embodiment of the device, the strips 5a providing the means for electrical coupling are jointed to the Au layer of the first metallic member employing an In—Ag solder.

In case of thicker first metallic members and when the member 2 and the strip 5a are manufactured from high-ohmic materials, as e.g. Ni—Cr alloys, the spot welding may be used as a jointing technique. Both types of joints may be used together as well. Thus, a 2 m long assembly of the quenchable superconductor 1, the first metallic member 2 and the second metallic member 3 was used the superconducting device according to this example. Various soldering materials comprising as Bi, In, Sn, Pb, Zn, Cd, Ag, Au, Cu, Zn or their alloys may be employed for these joints.

In operation, the quenchable superconductor 1 of the superconducting device is coupled with the power circuit (not shown here). The means for electrical coupling and the means for cooling of different parts of the device through heat interchange with a cooler or a cooling medium are activated, particularly, the system is filled with liquid nitrogen or/and the cryocooler is switched on. When the current transporting through the device is lower than the critical current the quenchable superconductor remains in the non-quenched state comprising practically a zero resistance.

When the transporting current exceeds the critical value, the quenchable superconductor 1 quenches to the quenched state which comprises a non-zero resistance in the quenchable superconductor. This non-zero resistance causes a quick re-distribution of currents in the device. A larger share of the total current starts to flow through the first metallic member 2 and the second metallic member 3. This is a result of rapid change of the ratio of impedances of parallel channels represented by the metallic members 2, 3 and the quenchable superconductor 1 during quenching.

Because of above mentioned constructive features, in the quenched state a larger share of the overload current is encouraged to flow from the quenched and, therefore, resistive superconductor 1 via the first metallic member 2 into the second metallic member 3 where it is dissipated more efficiently within the resistive member 4. Power dissipation in parallel resistances, e.g. R1 and R2, is, in general, proportional to the electrical conductances of the parallel channels, i.e. to 1/R1 and 1/R2. As the second metallic member 3 comprises a substantially lower electrical resistance than the first metallic member 2, the second metallic member 3 carries a substantially higher share of the power dissipation, which is, nevertheless, not exactly proportional to the electrical conductance while the current sharing mechanism in the given case, especially in dynamic modus, results in more complicated current distribution.

Since the resistive member 4 is thermally decoupled from the first metallic member 2, a rise in temperature in the resistive member 4 caused by the heat dissipation, is not conducted back into the first metallic member 2 to a large degree, which is, in turn, determined by quoted above features of the means for electrical coupling 5 with the first metallic member 2. As a result, the local temperature of the superconductor 1 can reduce more rapidly and the superconductor 1 can return to the superconducting state more quickly.

Because of the features of these two metallic members 2, 3 described above, the device yields a fast response, with a transient time of 25 microseconds, compared to a 2-5 millisecond response in the previous state of the art. In the quenched state the initial (nominal) current of 80 A was limited to ~60 A at average voltage per unit length of 2.4 V/cm which exceeds known thresholds (typically of 1 V/cm) of quenchable superconductors damage in similar systems at comparable current overloads.

In spite of high power dissipation, of 300 . . . 450 W/cm$^2$ during 50 milliseconds, no damage of the quenchable superconductor was observed. Total limited power was ~30 kW at dc voltage of 488V. Recovery time was very short: 1.5 milliseconds instead of 1100 milliseconds which correspond to the known state of the art.

Because of a relatively short length (only of 2 m) of the quenchable superconductor can be used for current conditioning at the power level of 30 KW the entire superconducting device for current conditioning may be produced in more cost-efficient way.

It was also shown that instead of dc current an ac current may be applied to the system. Furthermore, the coupling with the power circuit may be performed as a direct electric coupling (as in the above referred example) or as coupling through the magnetic flux (as in so called "inductive fault current limiters").

Figure 2:
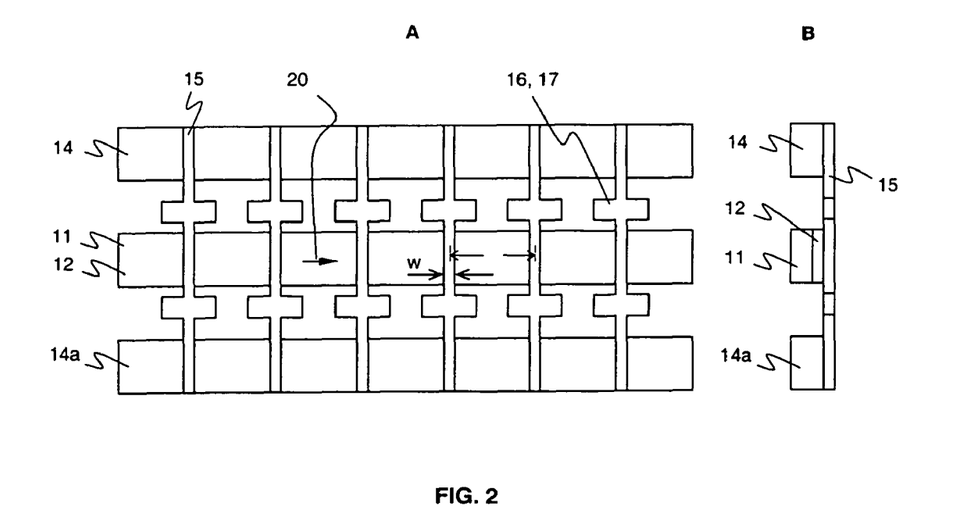
FIG. 2 illustrates a schematic front view (A) and side view (B) of a superconducting device for current conditioning according to a second embodiment.

FIG. 2 reveals schematically a front view (A) and a side view (B) of the superconducting device for current conditioning according to the second embodiment, particularly a part of the device that comprises several periods between the strips 15.

In the case of the embodiment illustrated in FIG. 2, there are two resistive elements 14, 14a, which are electrically coupled by the plurality of strips 15 with the first metallic member 12.

The two resistive elements 14, 14a both have an elongate strip-like form and are positioned adjacent opposing side edges of the quenchable superconductor 11 such that the long direction of the resistive elements 14, 14a is arranged generally parallel to the long direction of the quenchable superconductor 11. The quenchable superconductor 11 is arranged between the two resistive elements 14, 14a such that the resistive elements 14, 14a are spaced at a distance from the respective side edge of the quenchable superconductor 11.

The plurality of strips 15 of the second metallic member 13 are spaced at intervals along the length of the quenchable superconductor 11 and resistive elements 14,14a, respectively, such that the individual strips 15 extend approximately perpendicular to the side edge of the resistive elements 14, 14a and quenchable superconductor 11. Each strip 15 extends from a resistive element 14 over the quenchable superconductor 11 to the resistive element 14a positioned adjacent the opposing side edge of the quenchable superconductor 11.

The second metallic member 13 further comprises contact members 17 which extend from the strips 15 in a direction generally parallel to the long direction of the quenchable superconductor 11. The contact members 17 are positioned in the gap created between the quenchable superconductor 11 and the respective resistive elements 14,14a such that the contact members 17 are spaced at a distance from the quenchable superconductor 11 and the respective resistive elements 14,14a. As can be seen from the cross-sectional view, the strips 15 are jointed to a major surface of the resistive elements 14,14a and the first metallic member 12 arranged on the quenchable superconductor 11.

As can be seen in the side view, the resistive elements 14 and 14a are arranged generally coplanar with the quenchable superconductor 11.

The strips 15 are jointed with the first metallic member 12 comprising a jointing area that comprises from 2 to 30% area fraction of the total surface of the first metallic member 12.

In this embodiment, the fraction of the area is defined simply by a ratio of a distance between the centers of the neighboring strip joints and a width w of the strip (w is shown as dimension in FIG. 2). In case of periodical way of arrangement of the strips, the distance between the centers p (shown as dimension in FIG. 2) corresponds to the geometrical period of the structure taken in a direction 20 of current flow in the non-quenchable superconductor being in the superconducting state.

At the area fraction lower than 2%, the protection of the quenchable superconductor 1 via the second metallic member 3 at a quench event becomes insufficient which results typically in damage of the superconducting device.

At area fractions higher than 30%, the average voltage drop along the device considerably reduces, by about the same 30%. Therefore, a larger amount of superconducting tape would be required for the superconductive device. Because of this reason, the superconducting device for current conditioning may be produced more cost-effectively when the area fraction does not exceed the above referred 30%.

The additional means 16 for thermal coupling with the cooler or cooling medium comprise an additional contacting surface 17 that is provided at a strip 15a. As in case of FIG. 1, the contacting surface 17 is located preferably in the middle of the strip 15a. In this embodiment, the contacting surfaces 17 lay in the same plane as the strips 15a themselves. In other aspects the device is similar to the device of FIG. 1. In performance, the device of FIG. 2 yields practically the same quenching times and even shorter (0.8 milliseconds) recovery time.

Figure 3:
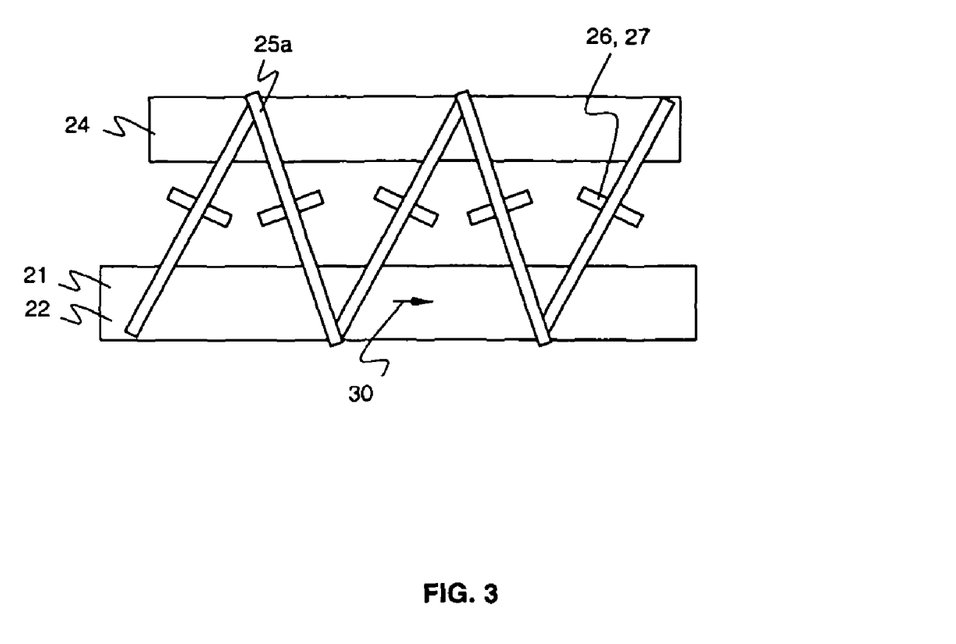
FIG. 3 illustrates a schematic view of a superconducting device for current conditioning according to a third embodiment.

A front view of a superconducting device for current conditioning according to a third embodiment is shown in FIG. 3. The device of the third embodiment, comprises a quenchable superconductor 21 having a strip form and a single resistive element 24 having a strip-form and arranged so that its long direction is generally parallel to the long direction of the quenchable superconductor 21. As in the first embodiment, the resistive element 24 is arranged adjacent and spaced at a distance from a side edge of the quenchable superconductor 21.

In the device of the third embodiment, at least some of the strips 25a from the plurality of strips 25 are arranged at an inclined angle with respect to the resistive element 24 and the quenchable superconductor 21. An inclined angle is used herein to exclude an angle of 90°. At least some of the strips 25a are jointed with the first metallic member 22 so as to comprise a jointed part that possesses an angle from 45° to 135° relative to the direction of current flow 30 in the quenchable superconductor 21 when in the superconducting state.

The portion of the strips 25a positioned between the first metallic member 22 and the resistive element 24 may follow different direction. Moreover, the inclined angle may be different for different strips as it is shown in FIG. 3. The additional means 26 for thermal coupling with the cooler or cooling medium comprise an additional contacting surface 27 that is provided at a strip 25a as in an example of FIG. 1. The additional means 26 is positioned in the space between the quenchable superconductor 21 and the resistive element 24.

The superconducting device with such angles of jointed parts may yield higher damage thresholds during quench events because of improved mechanical stability and electrical protection of the quenchable superconductor 21 as well as a further reduced reaction time due to optimized impedance.

Figure 4:
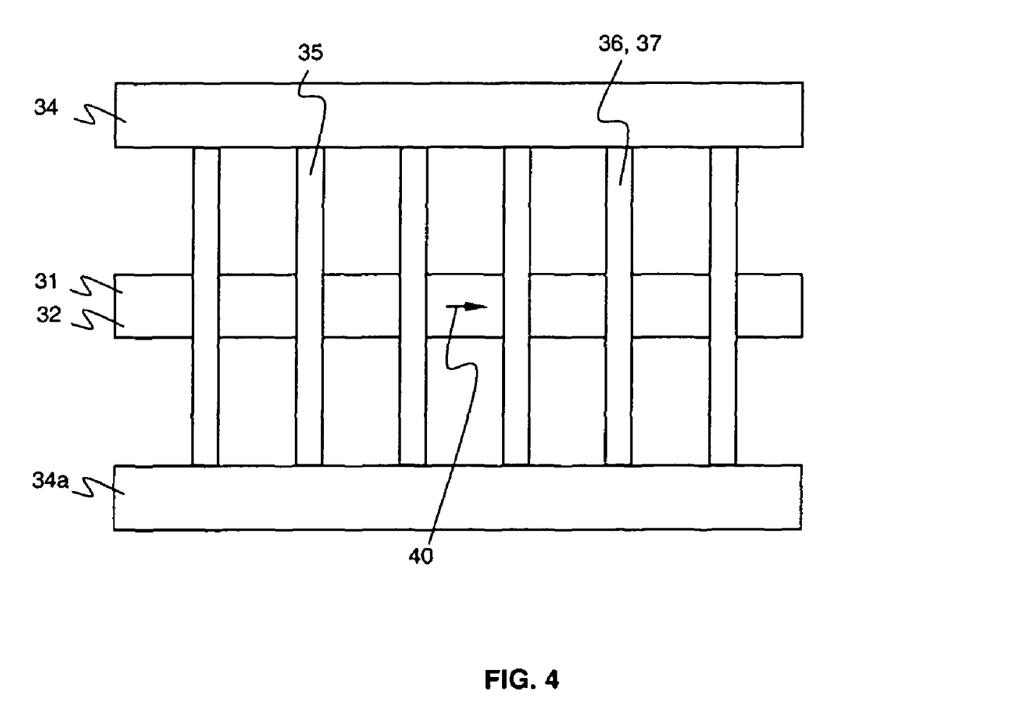
FIG. 4 illustrates a schematic view of a superconducting device for current conditioning according to a fourth embodiment.

A schematic view a superconducting device for current conditioning according to a fourth embodiment is depicted in FIG. 4. The device is very similar to that one shown in FIG. 2 with a difference that a role of the contacting surfaces 7, are provided by a middle part 37 of the body of the strips 35 which extends generally parallel to the long direction of the strips 35 and perpendicularly to the long direction of the quenchable superconductor 31.

Figure 5:
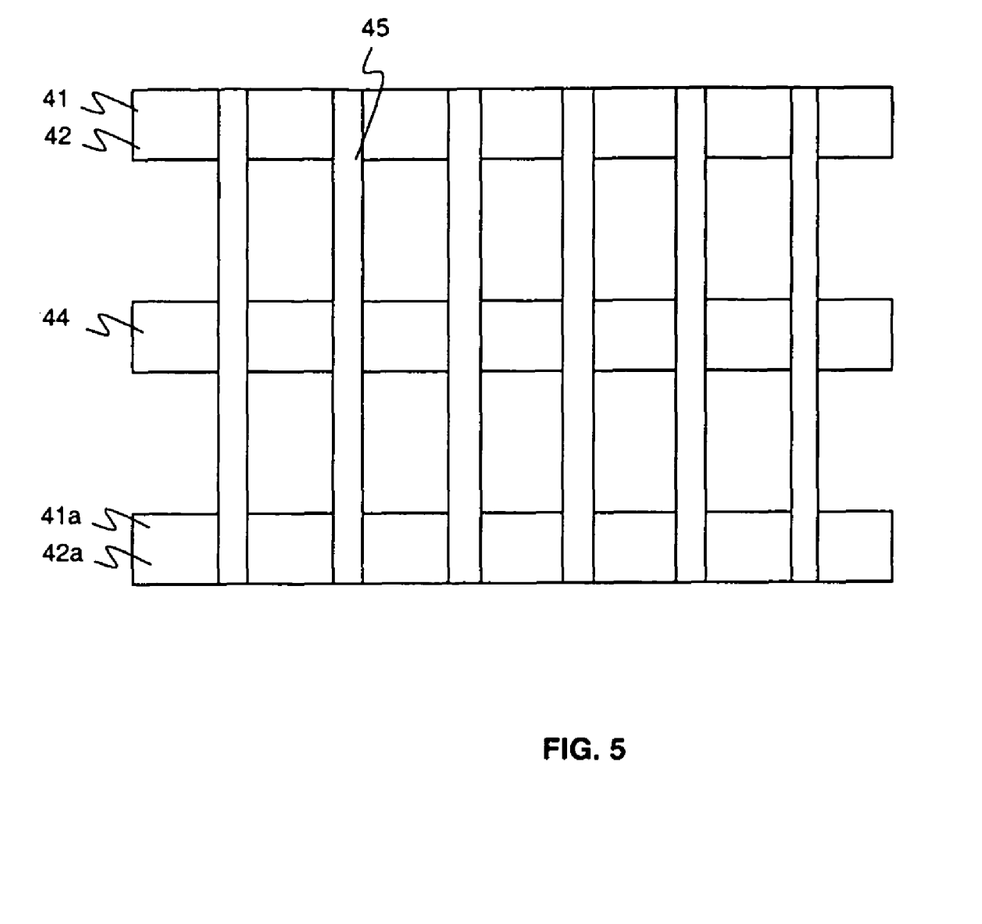
FIG. 5 illustrates a superconducting device for current conditioning according to a fifth embodiment.

FIG. 5 illustrates a superconducting device according to a fifth embodiment in which the quenchable superconductor and the first metallic member are split into to strips 41, 42 and 41a, 42a which are arranged adjacent, and spaced at a distance from, two opposing edge sides of a centrally arranged resistive member 44.

The first metallic member 42, 42a is coupled with the restive element 44 using a plurality of strips 45 spaced at intervals along the length of the quenchable superconductor 41 and 41a and the resistive element 44. In this embodiment, the strips 45 are arranged generally perpendicularly to the side edges of the quenchable superconductor 41, 41a and the resistive element 44, although in other non-illustrated embodiments, they are arranged at an inclined angle. The quenchable superconductors 41, 41a and the resistive element 44, are generally coplanar. In some applications, the embodiments depicted in FIG. 4 and FIG. 5 may lead to a more cost-effective solution for the superconducting device.

Figure 6:
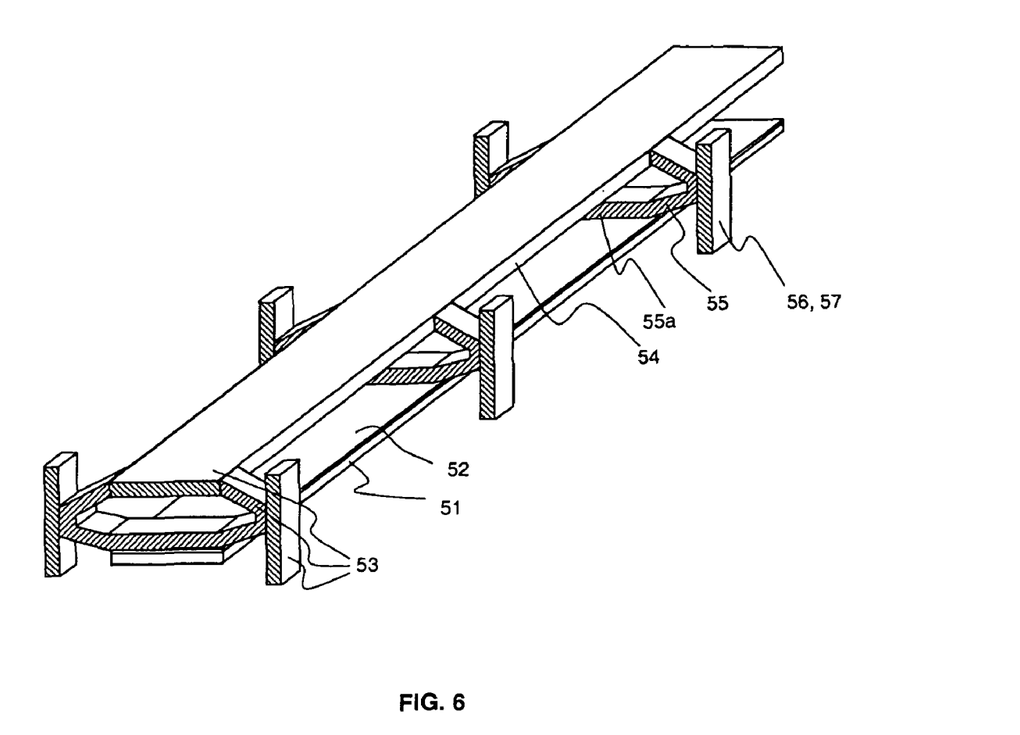
FIG. 6 illustrates a superconducting device for current conditioning according to a sixth embodiment.

FIG. 6 illustrates a superconducting device for current conditioning according to a sixth embodiment. In the sixth embodiment, the superconducting device comprises a more pronounced 3D structure due to decoupling of the quenchable superconductor 51 and the first metallic member 52 with the resistive element 54 through a curved shape of the strips 55.

In the sixth embodiment, the resistive element 54 is arranged so that its major face faces towards a major face of the second metallic member 52 positioned directly on the major face of the quenchable superconductor 51. The major face of the resistive element 54 is spaced at a distance from the major face of the quenchable superconductor 51 by a plurality of strips 55 spaced at intervals along the length of the quenchable superconductor 51 and resistive element 54 which act as spacing elements.

Each of the strips 55 comprises a general U-form with the base of the U being positioned on the second metallic member 52 and the distal ends of the side wall portions of the U extending upwards and away from the major surface of the second metallic member 52. In this embodiment, the resistive element 54 is positioned between the open ends of the U. However, a strip having an oval type cross-section, in which the opposing long side of the oval is arranged on the resistive element may also be provided to provide a spacer.

In the sixth embodiment, the sides walls of the strips 55 providing the spacers have a rounded form such that a portion of the side wall protrudes over the opposing side edge of the quenchable superconductor 51 and the resistive element 54.

As in the previously described embodiments, the strips 55 are equipped with the additional means 56 for thermal coupling with the cooler or cooling medium; the additional means 56 comprise the additional contacting surfaces 57 placed from both sides from the quenchable superconductor 51 or the resistive element 54.

The contacting surfaces 57 are provided in the from of a strip or rod which is attached to the outermost position of the rounded side walls of the strips 55 such that the contacting surfaces 57 are arranged adjacent, and spaced at a distance from, a side edge of the quenchable superconductor 51 and the resistive element 54. Furthermore, the contacting elements extend in a direction generally perpendicular to the major faces of the quenchable superconductor 51 and resistive element 54 and the long direction of the quenchable superconductor 51 and resistive element 54. The superconducting device according to FIG. 6 may provide further shortage of the quenching time yielding practically the same recovery time as in the case of FIG. 1.

Figure 7:
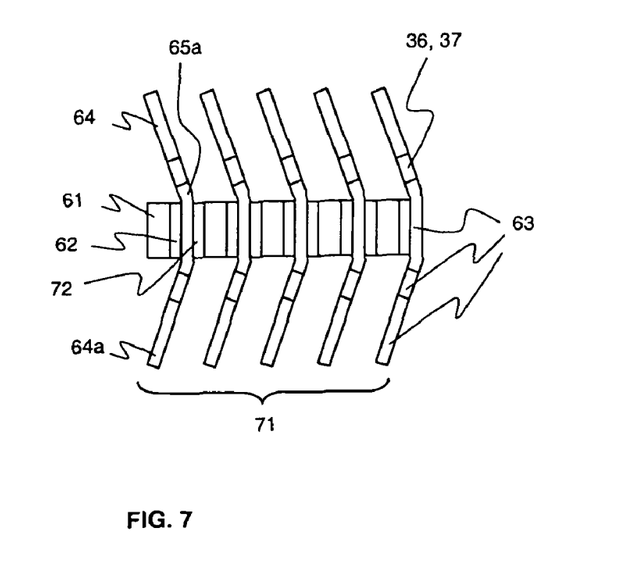
FIG. 7 illustrates a superconducting device for current conditioning comprising an insulated assembly according to a seventh embodiment.

FIG. 7 illustrates a superconducting device according to a seventh embodiment in which an assembly 71 comprising the quenchable superconductor 61, the first metallic member 62 and the second metallic member 63 comprises further an insulating spacer 72 attached to one of the outer surfaces of the assembly 71. The insulating spacer 72 is partly transparent for the cooling medium, i.e. is provided with grooves, channels or openings which make possible a direct contact of the quenchable superconductor with the cooling medium. The insulating spacer may be provided as a plate or an insulating layer, e.g. epoxy resin, of an insulating plastic, e.g. Teflon, Kapton, glass fiber filled with epoxy, etc., or ceramics, e.g. alumina, ceria, zirconia, etc.

According to the embodiment of FIG. 7, the means 63 comprise a non-planar form, in particular comprise bent strips 65a, which couple the first metallic member 62 with the resistive element consisting of two parts 64 and 64a which are arranged adjacent opposing side edges of the quenchable superconductor 61. The bent strips 65 extend over the two opposing side edges of the quenchable superconductor 61 providing a plurality of fins arranged at an inclined angle with respect to the long direction of the quenchable superconductor 61.

Such a type of superconducting device allows provide assemblies with either series or parallel connections of the quenchable superconductors without deterioration of time performance during current conditioning. The assemblies with the insulating member allow to provide a compact and therefore a cost-effective superconducting device.

What is claimed is:

1. A superconducting device for current conditioning comprising
    a quenchable superconductor which is capable to quench from a superconducting state comprising zero resistance to a quenched state comprising a non-zero resistance when the transporting current exceeds a critical value,
    a first metallic member electrically coupled with the quenchable superconductor, and thermally coupled with the quenchable superconductor, wherein
    the superconducting device comprises a second metallic member comprising a resistive element and means for electrical coupling the resistive element with the first metallic member,
    the resistive element of the second metallic member is thermally decoupled from the first metallic member,
    the first metallic member comprises a substantially higher electrical resistance compared to the second metallic member.

2. The superconducting device according to claim 1, wherein the resistive element of the second metallic member is electrically coupled with the first metallic member by a plurality of strips as the means for electrical coupling.

3. The superconducting device according to claim 2, wherein each strip from the plurality of strips is electrically joined with the first metallic member and with the resistive element.

4. The superconducting device according to claim 2, wherein the plurality of strips is joined with the first metallic member comprising a jointing area that comprises from 2 to 30% area fraction of the total surface of the first metallic member.

5. The superconducting device according to claim 2, wherein at least some of the strips from the plurality of strips joined with the first metallic member comprise a jointed part that possesses an angle from 45° to 135° relative to the direction of current flow in the quenchable superconductor in the superconducting state.

6. The superconducting device according to claim 2, wherein the electrical resistance of each strip is lower than the electrical resistance of the resistive element measured between two neighboring strips in the direction of current flow in the quenchable superconductor in the superconducting state by a factor of 10-2000.

7. The superconducting device according to claim 1, wherein the means for electrical coupling with the first metallic member comprise additional means for thermal coupling with a cooler or cooling medium.

8. The superconducting device according to claim 7, wherein the additional means comprise an additional contacting surface that is provided at a strip that belongs to the plurality of strips.

9. The superconducting device according to claim 8, wherein the contacting surface is located in the middle of the strip.

10. The superconducting device according to claim 1, wherein the resistive element and the first metallic member are spaced apart by a low thermal conducting medium or by the cooling medium.

11. The superconducting device according to claim 1, wherein the electrical resistance of the quenchable superconductor in the quenched state exceeds the electrical resistance of the first metallic member by a factor f1, wherein $2 \leq f1 \leq 500$.

12. The superconducting device according to claim 1, wherein the electrical resistance of the first metallic member exceeds the electrical resistance of the second metallic member by a factor f2, wherein $5 \leq f2 \leq 200$.

13. The superconducting device according to claim 1, wherein the first metallic member comprises a heat capacity per unit length that is from 5 to 20000 times lower than the heat capacity per unit length of the second metallic member.

14. The superconducting device according to claim 1, wherein the quenchable superconductor is a superconducting film deposited on a substrate.

15. The superconducting device according to claim 14, wherein the substrate is provided with at least one buffer layer.

16. The superconducting device according to claim 1, wherein the quenchable superconductor comprises a $ReBa_y Cu_z O_{7-u}$-based composition or a $((Re1_w+Re2_{x-w})Ba_y Cu_z O_{7-u})$- based composition where Re, Re1 and Re2 denote one or more metals from the group consisting of Y, Ho, La, Pr, Nd, Gd, Sm, Sc, Tu, Tb, Dy, and Yb, Re1 differs from Re2, and where x is taken from the range from 0.8 to 1.2, y is taken from the ranges from 1.6 to 2.4, z is taken from the range from 2.4 to 3.6, and u and w are taken from the range from 0.05 to 0.95.

17. The superconducting device according to claim 1, wherein the first metallic member is a layer of a normal metal selected from the group consisting of Ag, Au, Zn, Cu, Ni, Cr, Pt, W, Ta, Ti, Mo or an alloy comprising one or more of these metals.

18. The superconducting device according to claim 1, wherein the second metallic member comprises a material or materials which comprise one or more of the normal metals selected from the group consisting of Ag, Au, Re, Pt, Cu, Zn, Al, Fe, Ni, Cr, W, Ta, Mn, Mg, Ti, Mo or combination of these metals or their alloys.

19. The superconducting device according to claim 1, wherein the means for electrical coupling with the first metallic member comprise at least one of solder and spot welded joints.

20. The superconducting device according to claim 1, wherein an assembly comprising the quenchable superconductor, the first metallic member and the second metallic member comprises further an insulating spacer attached to one of the outer surfaces of the assembly.

21. The superconducting device according to claim 20, wherein the insulating spacer is partly transparent for the cooling medium.

22. The superconducting device according to claim 1, further comprising means for electrical coupling an external current source to the quenchable superconductor.

23. The superconducting device according to claim 1, further comprising means for cooling at least parts of the device through heat interchange with a cooler or a cooling medium.

* * * * *